(12) United States Patent
Han et al.

(10) Patent No.: US 11,929,536 B2
(45) Date of Patent: Mar. 12, 2024

(54) FILTER CABLE

(71) Applicant: Yunan Han, Beijing (CN)

(72) Inventors: Yunan Han, Beijing (CN); Xueying Han, Beijing (CN)

( * ) Notice: Subject to any disclaimer, the term of this patent is extended or adjusted under 35 U.S.C. 154(b) by 435 days.

(21) Appl. No.: 17/268,695

(22) PCT Filed: Apr. 13, 2020

(86) PCT No.: PCT/CN2020/084367
§ 371 (c)(1),
(2) Date: Feb. 16, 2021

(87) PCT Pub. No.: WO2021/207867
PCT Pub. Date: Oct. 21, 2021

(65) Prior Publication Data
US 2022/0123448 A1 Apr. 21, 2022

(51) Int. Cl.
*H01P 1/20* (2006.01)
*H01B 7/00* (2006.01)
*H01B 11/18* (2006.01)
*H03H 1/00* (2006.01)
*H03H 7/01* (2006.01)

(52) U.S. Cl.
CPC ............. *H01P 1/20* (2013.01); *H01B 7/0009* (2013.01); *H01B 11/1895* (2013.01); *H03H 7/0115* (2013.01); *H03H 1/0007* (2013.01)

(58) Field of Classification Search
CPC ...... H03H 1/0007; H03H 7/0115; H01P 1/202
USPC ................................ 333/175, 181, 185, 206
See application file for complete search history.

(56) References Cited

FOREIGN PATENT DOCUMENTS

| CN | 102629703 A | 8/2012 |
|---|---|---|
| CN | 108986961 A | 12/2018 |

OTHER PUBLICATIONS

Jp2006295792, English Translation provided (Year: 2006).*

* cited by examiner

*Primary Examiner* — Rakesh B Patel
(74) *Attorney, Agent, or Firm* — Bay State IP, LLC

(57) ABSTRACT

A filter cable, which solves the problem that devices which can better cope with various problems in complex electromagnetic environment and have simple and reasonable structural design are lacking in the related art. The filter cable comprises a core wire; the core wire comprises an insulating substrate and a first conductor layer surrounding the insulating substrate; the first conductor layer has a first etching pattern; the first etching pattern is distributed along the axial direction of the filter cable; and the first etching pattern is used to make the filter cable equivalent to a first filter circuit to realize the filtering function.

10 Claims, 2 Drawing Sheets

FILTER CABLE

CROSS REFERENCE TO RELATED APPLICATION

This application is for entry into the U.S. National Phase under § 371 for International Application No. PCT/CN2020/084367 having an international filing date of Apr. 13, 2020, and from which priority is claimed under all applicable sections of Title 35 of the United States Code including, but not limited to, Sections 120, 363, and 365(c).

TECHNICAL FIELD

The present application relates to the technical field of cables, in particular to a filter cable.

BACKGROUND

With the rapid growth of wireless devices, intelligent electronic devices are facing more complex electromagnetic environment in the whole life cycle. A cable is a necessary interconnecting part within and between electronic devices. As a current-carrying conductor, it can not only conduct Electro Magnetic Interference (EMI), but also transmit and receive the surrounding electromagnetic waves, bringing Electromagnetic Compatibility (EMC) problems of electronic devices. In order to solve these problems, shielded cables and filters in centralized filtering mode are mostly used in the connection between and inside devices in the complex electromagnetic environment at present, which will be introduced by way of an example:

- A shielded cable, which is a generally single cable or is integrally wrapped with a shielding layer, wherein the shielding layer is connected with a device shell through connectors and has the function of shielding without filtering;
- A coaxial line, which has electromagnetic shielding performance, is capable of providing a fixed impedance and a stable phase in a wide frequency band, but has no filtering function;
- An optical fiber, which transmits signals with low loss through total reflection of light, and also greatly reduces interference, wherein at present, there are few interconnection applications within and between devices, and optical devices and photoelectric change devices are relatively complex;
- A filtering magnetic ring, wherein the cable passes through the magnetic ring to suppress the high-frequency interference signal on the wire, and the disadvantage is that it is heavy, cannot be bent, and requires high use environment;
- A low-temperature co-fired ceramic filter, which is a multilayer filter, and is commonly used in a mobile communication terminal, wherein the advantage lies in extremely small size, while the disadvantage lies in low quality factor and large insertion loss.

It can be seen that in the related art, shielded cables and coaxial lines have shielding performance but cannot be filtered. Because complex electromagnetic environment is distributed around cables and devices, the structure in centralized filtering mode such as a filtering magnetic ring and a low-temperature co-fired ceramic filter cannot well solve the distributed interference problem. In the distributed complex electromagnetic environment effect of the centralized filtering mode, because both ends of the connection will be coupled with electromagnetic interference, the filtering effect will be greatly reduced. The installation point of the structure in centralized filtering mode requires a high degree of isolation at both ends to avoid mutual interference between both ends. The requirement on use conditions is high. The installation of the structure in centralized filtering mode requires a large space and weight, which limits the present application range.

To sum up, the related art lacks devices which can better cope with various problems in complex electromagnetic environment and have simple and reasonable structural design.

SUMMARY

The purpose of the present application is to provide a filter cable, which is used to solve the problem that devices which can better cope with various problems in complex electromagnetic environment and have simple and reasonable structural design are lacking.

The purpose of the present application is realized by the following technical scheme:

A filter cable, comprising a core wire; wherein the core wire comprises an insulating substrate and a first conductor layer surrounding the insulating substrate; the first conductor layer has a first etching pattern; the first etching pattern is distributed along the axial direction of the filter cable; and the first etching pattern is used to make the filter cable equivalent to a first filter circuit to realize the filtering function.

In a possible design, the first etching pattern is distributed periodically or aperiodically along the axial direction of the filter cable.

In a possible design, the etching area of the first etching pattern is hollow or filled with insulating material.

In a possible design, the first conductor layer is plated on the insulating substrate or the first conductor layer is wrapped on the insulating substrate.

In a possible design, the first etching pattern comprises a plurality of groups of cascade patterns;

each group of cascade patterns comprises a first concave pattern, a second concave pattern and a third concave pattern which are opened along the axial direction of the filter cable, the third concave pattern surrounds the outer side of the second concave pattern, and the second concave pattern surrounds the outer side of the first concave pattern.

In a possible design, the sizes of a plurality of groups of cascaded patterns are not completely the same.

In a possible design, the first etching pattern comprises a pattern with Hilbert fractal structure.

In a possible design, the filter cable further comprises a first filling layer surrounding the core wire and a second conductor layer surrounding the first filling layer; wherein the second conductor layer has a second etching pattern; the second etching pattern is distributed along the axial direction of the filter cable; and the second etching pattern is used to make the filter cable equivalent to a second filter circuit to realize the filtering function.

In a possible design, the shape of the second etching pattern is completely the same as that of the first etching pattern; alternatively, the shape of the second etching pattern is completely different from that of the first etching pattern.

In a possible design, the filter cable further comprises a second filling layer surrounding the second conductor layer and a shielding layer surrounding the second filling layer; wherein a ground terminal is provided on the shielding layer.

DESCRIPTION OF THE EMBODIMENTS

In order to make the purpose, technical scheme and advantages of the present application clearer, the present application will be further described in detail with reference to the attached drawings.

Embodiments

Figure 1:
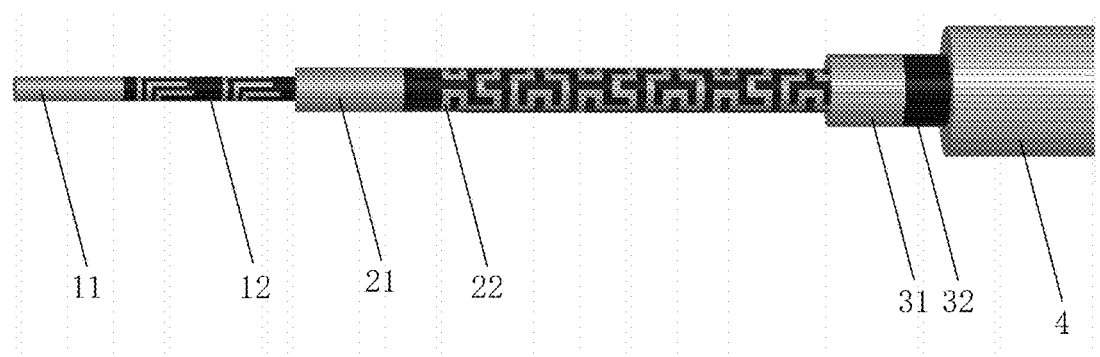
FIG. 1 is a schematic structural diagram of a filter cable according to an embodiment of the present application.

Referring to FIG. 1, FIG. 1 is a schematic structural diagram of a filter cable according to an embodiment of the present application.

As shown in FIG. 1, a filter cable provided in this embodiment comprises a core wire; wherein the core wire comprises an insulating substrate 11 and a first conductor layer 12 surrounding the insulating substrate 11; the first conductor layer 12 has a first etching pattern; the first etching pattern is distributed along the axial direction of the filter cable; and the first etching pattern is used to make the filter cable equivalent to a first filter circuit to realize the filtering function.

The first etching pattern is dispersed on the whole insulating substrate along the axial direction of the filter cable, and specifically, the first etching pattern can be distributed periodically or aperiodically along the axial direction of the filter cable.

An embodiment of the present application provides a filter cable that can better cope with various problems in complex electromagnetic environment. In the filter cable, the traditional core structure of a solid copper wire is not adopted, but an insulating substrate is provided. Then a first conductor layer is surrounded on the insulating substrate. The first conductor layer has a first etching pattern. The first etching pattern can make the filter cable equivalent to a required filter circuit to realize the filtering function. In the first aspect, since the core wire of the structure of the cable itself is filtered, no additional components are needed. The cable itself is simple in structure, small in size, light in weight, capable of being bent randomly, convenient to install, and wide in application range, and avoids a series of problems caused by adopting other components. In the second aspect, the first etching pattern is distributed on the cable, so the cable has good filtering characteristics as a whole, and the effect is more remarkable in response to the distributed electromagnetic environment. In the third aspect, the input and output ends of the filter circuit are distributed at both ends of the filter cable, so there is no large coupling, and the filter effect is better. In the fourth aspect, the core wire in the filter cable uses an insulating substrate, which saves conductor materials and further reduces weight.

The filter cable provided by the present application can be applied in a wide range of scenarios, such as interconnection between electronic devices, interconnection between electronic devices and power supply devices, interconnection between internal modules of electronic devices, interconnection between internal modules of intelligent robots, interconnection between internal and external intelligent numerical control machine tools, etc., which require wired transmission of power and signals, especially in the complex electromagnetic environment.

It should be noted that the number of core wires in the filter cable can be set according to actual needs, which can include one core wire or a plurality of core wires.

In practical application, the first conductor layer in the core wire can be provided on the insulating substrate in various ways. For example, the first conductor layer can be plated (such as electroplated, etc.) on the insulating substrate. For another example, the first conductor layer can be wrapped around the insulating substrate. Under these arrangements, the first conductor layer keeps the same thermal expansion coefficient as the insulating substrate, which is not easy to be bent, is less affected by ambient temperature and is more stable. In addition, the shape of the insulating substrate can be set as a solid cylinder or other required shapes.

In specific implementation, there are many specific structures of the first etching pattern, and two possible structures are listed but not limited hereinafter.

Structure 1

Figure 2:
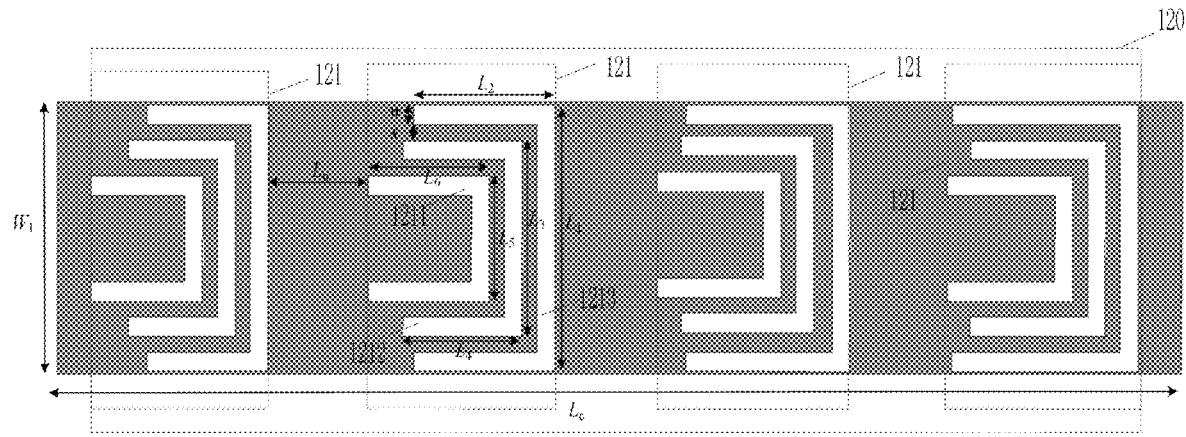
FIG. 2 is a structural schematic diagram of a first etching pattern according to another embodiment of the present application.

In this embodiment, as shown in FIG. 2, the first etching pattern 120 comprises a plurality of groups of cascade patterns 121; each group of cascade patterns 121 comprises a first concave pattern 1211, a second concave pattern 1212 and a third concave pattern 1213 which are opened along the axial direction of the filter cable, the third concave pattern 1213 surrounds the outer side of the second concave pattern 1212, and the second concave pattern 1212 surrounds the outer side of the first concave pattern 1211. The third concave pattern 1213 is spaced from the second concave pattern 1212, and the second concave pattern 1212 is spaced from the first concave pattern 1211.

It can be seen from FIG. 2 that the concave pattern comprises a bottom edge opposite to the concave opening and two sides adjacent to the bottom edge. The bottom edge and two sides are all etching areas. The sizes of the concave patterns, i.e. the sizes of the bottom edge and the two sides (including the length and width of the sides), can be set according to actual needs, wherein the lengths of the two sides are equal.

It can be seen from FIG. 2 that each group of cascaded patterns contains three adjacent concave fold lines. Based on this, the length of each concave pattern forms a stop band, so that a plurality of concave patterns form a stop band of a plurality of frequency points. The low-pass effect is formed when a number of concave patterns are superimposed to a certain extent. Each concave equivalent circuit comprises a resonant circuit consisted of an inductor $L_i$ and a capacitor $C_i$ in parallel, which has a band-stop function. The values of inductance and capacitance are positively related to the total length (i.e., the sum of the lengths of the bottom edge and two sides) and the width (i.e., the width of each side) of the concave pattern, and the positional relationship of a plurality of concave patterns will also affect the equivalent inductance and capacitance of each concave pattern.

As shown in FIG. 2, the sizes of a plurality of groups of cascaded patterns may not be completely the same. In implementation, the size of each concave pattern may be adjusted as needed to achieve an ideal filtering effect.

In addition, the number of groups of cascaded patterns is not limited, and can be set according to filtering requirements.

Structure 2

Figure 3:
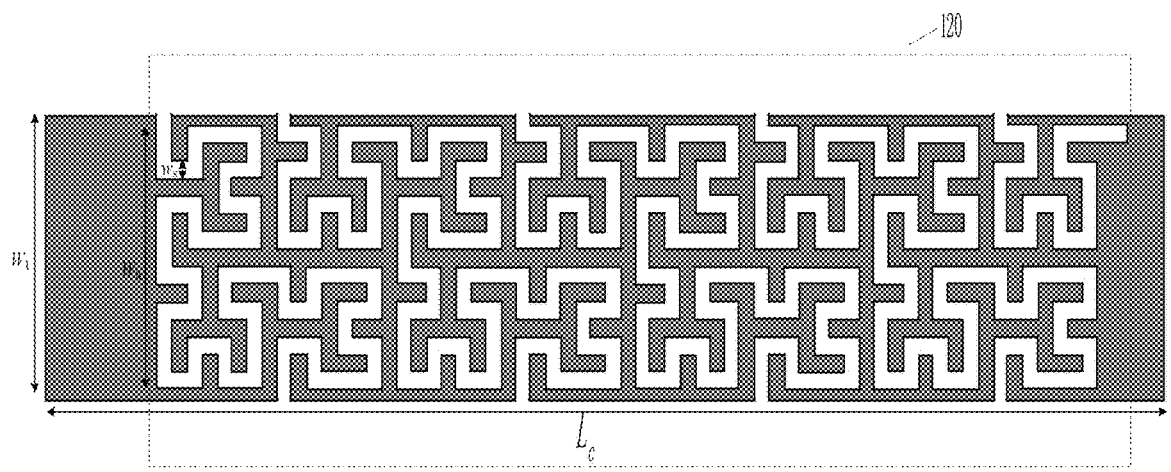
FIG. 3 is a structural schematic diagram of a first etching pattern according to another embodiment of the present application.

In this embodiment, as shown in FIG. 3, the first etching pattern 120 comprises a pattern with Hilbert fractal structure. It can be seen from FIG. 3 that the pattern is an etching pattern consisted of Hilbert curves with a certain line width. The size of the first etching pattern, that is, the width of the whole pattern along the radial cross section of the filter cable and the width of the segment of the Hilbert fractal structure along the axial cross section of the filter cable, can be set according to actual needs to achieve an ideal filtering effect.

Two possible specific structures of the first etching pattern are listed above. In implementation, patterns of various structures can be designed according to needs to achieve the effects of various required filter circuits. The filter circuits that can be realized can comprise low-pass filter circuits, band-pass filter circuits, band-stop filter circuits or high-pass filter circuits, and so on.

In specific implementation, in order to further enhance the filtering effect of the filter cable, in a possible design, as shown in FIG. 1, the filter cable may further comprises a first filling layer 21 surrounding the core wire and a second conductor layer 22 surrounding the first filling layer 21; wherein the second conductor layer 22 has a second etching pattern; the second etching pattern is distributed along the axial direction of the filter cable; and the second etching pattern is used to make the filter cable equivalent to a second filter circuit to realize the filtering function. In this embodiment, a second conductor layer 22 is provided outside the core wire, and a second etching pattern is also provided on the second conductor layer 22 to further enhance the filtering effect.

In implementation, the shape of the second etching pattern is completely the same as that of the first etching pattern; alternatively, the shape of the second etching pattern is completely different from that of the first etching pattern, which can be flexibly set according to the actual situation, as long as the required filtering effect can be achieved.

It should be noted that the second conductor layer can be set as one layer or a plurality of sub-conductor layers. If a plurality of sub-conductor layers are set, the sub-conductor layers are insulated from each other. For example, the sub-conductor layers can be insulated by filling layers.

It can be understood that, as shown in FIG. 1, the filter cable may further comprise a second filling layer 31 surrounding the second conductor layer 22 and a shielding layer 32 surrounding the second filling layer 31; and a ground terminal is provided on the shielding layer 32. In this way, in combination with the filtering function and the shielding function of the filter cable, it can better cope with the complex electromagnetic environment, and the performance has been further improved.

The ground terminal can be provided at both ends of the filter cable, and the device shell can be grounded by connection at both ends of the filter cable. Of course, a plurality of ground terminals can also be provided in the middle of the filter cable to realize multi-point grounding.

Similarly, it should be noted that the shielding layer can be set as one layer or a plurality of shielding layers. If a plurality of sub-shielding layers are set, the sub-shielding layers are insulated from each other. For example, the sub-shielding layers can be insulated by filling layers.

Of course, if the second conductor layer is not provided, the shielding layer can be directly wrapped on the first filling layer.

In order to protect the filter cable, as shown in FIG. 1, the filter cable may further comprise an outer sheath 4 provided outside the shielding layer 32. The outer sheath is a structure that physically protects the filter cable on the outermost layer of the filter cable and prolongs the service life of the filter cable.

It should be noted that FIG. 1 is only an exemplary structure of a filter cable, which is not limited, and other structures may be adopted.

The materials that can be used for each layer structure in the filter cable will be described hereinafter.

In specific implementation, the insulating substrate in the core wire can be made of Kevlar, Teflon and other insulating materials, which are lighter than traditional copper materials and are more conducive to reducing the weight of the cable. Of course, it can be made of other materials, which are not listed here. The material of the first conductor layer may include, but is not limited to, metal, metal alloy, metal plating or conductive polymer, for example, pure copper, cooper-plating silver or ladle cooper-plating silver, etc. In the implementation, the structure of the core wire can be a Kevlar wire coated with silver, and the silver-plating layer is etched with a first etching pattern, or the structure may be a flexible printed circuit board made of flexible media such as a polyimide film or a Liquid Crystal Polymer (LCP) film wrapped outside polytetrafluoroethylene.

The second conductor layer may be made of the same material as the first conductor layer, which will not be described in detail here.

Typical embodiments of the core wire and the second conductor layer are flexible printed circuit boards made of flexible media such as a polyimide film or an LCP film. Because the flexible printed circuit board has excellent electrical property and good processing property, it is easy to design and manufacture the required core wire and the second conductor layer with a flexible medium substrate, which can be applied to filter cables with different characteristics.

The shielding layer may include, but is not limited to, a cooper-plating silver tape, an ultra-light silver-plated metal woven layer, a copper nickel-plated woven layer or a cooper-plating silver woven mesh.

The material of each filling layer can be, but is not limited to, polytetrafluoroethylene or polyethylene. In the implementation, the second filling layer is uniformly wrapped on the outer side of the second conductor layer in the manner of winding or extrusion foaming with insulating materials such as polytetrafluoroethylene or polyethylene.

The material of the outer sheath can include, but is not limited to, polytetrafluoroethylene, polyethylene, fluorinated ethylene propylene polymer, silicone rubber, polyurethane, stainless steel, RADOX, neoprene or low-smoke halogen-free materials.

The filter cable provided in the present application will be described in more detail by taking a specific application scenario as an example.

In the first scenario, low-pass filtering needs to be implemented, and the first etching pattern shown in FIG. 2 is used specifically as follows.

Figure 4:
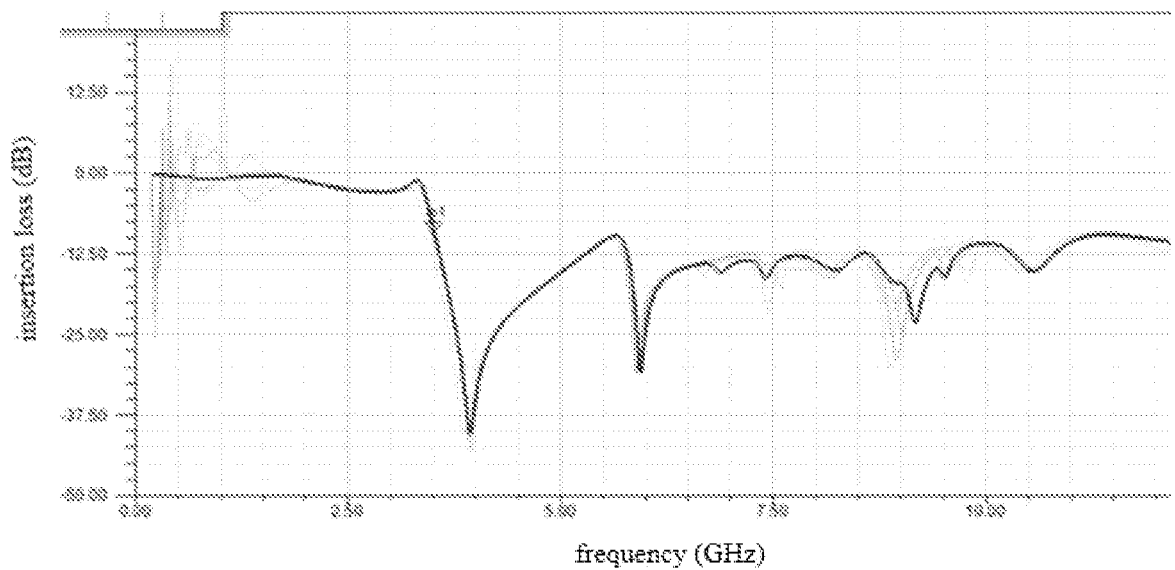
FIG. 4 is a schematic diagram of the filtering effect of a filter cable according to another embodiment of the present application.

A copper layer with four groups of cascade patterns is constructed on the polyimide film substrate as the first conductor layer, which is wrapped outside the insulating substrate of the filter cable to realize the low-pass filtering function of the filter cable. In addition, the first conductor layer is wrapped with a shielding layer. Of course, the shielding layer is insulated from the first conductor layer by a filling layer. A group of cascaded patterns in FIG. 2 is taken as a structural diagram of a resonant unit, in which typical values of structural parameters are: the relative dielectric constant of the polyimide film substrate $\varepsilon_r=3.8$, the dielectric loss tangent tan δ=0.008, and the substrate size: length $L_c$×width $W_1$×height $H_{sub}$=15.5 mm×4 mm×0.0254 mm. The resonant unit has the sizes: the width of each side w=0.25 mm, the distance between adjacent concave patterns s=0.2 mm. The length of each side of concave patterns is as follows: the length of the bottom edge of the third concave pattern is $L_1$=3.4 mm, the length of the side of the third concave pattern is $L_2$=2.57 mm, and the length of the bottom edge of the second concave pattern is $L_3$=2.5 mm, the length of the side of the second concave pattern is $L_4$=1.87 mm, the length of the bottom edge of the first concave pattern is $L_5$=1.6 mm, and the length of the side of the first concave pattern is $L_6$=1.74 mm. A distance between adjacent cascade patterns is $L_u$=1.33 mm. If the radius of the filter cable is small, the resonance frequency of the filter will be lower and the effect will be better. The radius of the typical insulating substrate is 0.53 mm, and the radius of the shielding layer is 2.4 mm. The filter cable realized by the structure of this embodiment has the performance of a strong transition band (TB), an ultra-wide stop band (SB) and a high stop band. The first conductor layer with four groups of cascaded resonance units proposed by this embodiment has a compact size of 15.5 mm×0.4 mm×0.0254 mm. As shown in FIG. 4, which is an effect diagram of insertion loss (that is, plug loss) achieved by the filter cable of this embodiment, it can be seen that the filter cable in this embodiment is a low-pass filter cable. The insertion loss effect of a filter cable with a length of about 0.1 m is less than 0.5 dB at 0-3 GHz and more than 10 dB at 3.5-12 GHz. In FIG. 4, the abscissa represents frequency in GHz (i.e., GH), and the ordinate represents insertion loss in dB.

In the second scenario, low-pass filtering needs to be implemented, and the first etching pattern shown in FIG. 3 is used specifically as follows.

Figure 5:
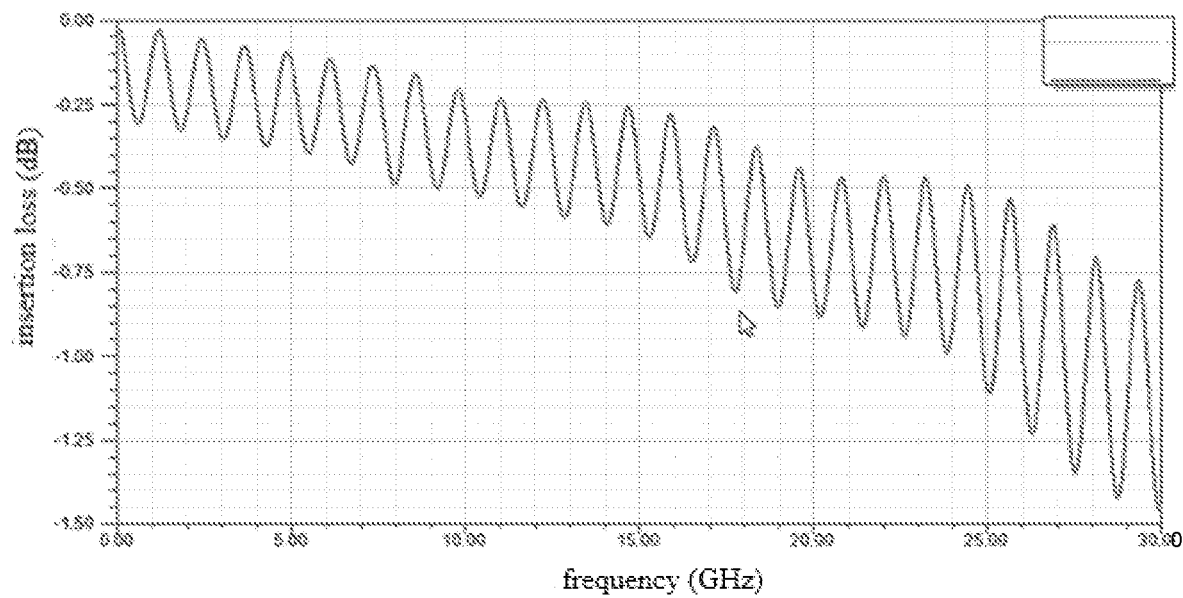
FIG. 5 is a schematic diagram of the filtering effect of a filter cable according to another embodiment of the present application.

In this scenario, the main difference from scenario 1 is that the pattern shown in FIG. 3 is used, $W_1$=5.19 mm, the length of the first etching pattern in the radial cross section of the filter cable is $W_h$=4.875 mm, $L_c$=24.8 mm, and the width of the section of the Hilbert fractal structure along the axial cross section of the filter cable is $W_S$=0.325 mm. The filtering cable with this structure can achieve the filtering effect shown in FIG. 5, in which a periodic loss occurs with frequency as a period. With the increase of frequency, the attenuation gradually increases. In practical use, because fractal structures are connected in series in cables, the insertion loss will be further increased, and better low-pass filtering effect can be achieved.

In the description of this specification, descriptions referring to the terms "one embodiment", "some embodiments", "example", "specific example", or "some examples" mean that specific features, structures, materials or characteristics described in connection with this embodiment or example are included in at least one embodiment or example of the present application. In this specification, the schematic expressions of the above terms do not necessarily refer to the same embodiments or examples. Furthermore, the specific features, structures, materials or characteristics described may be combined in any one or more embodiments or examples in a suitable manner.

Although the embodiments of the present application have been shown and described above, it can be understood that the above embodiments are exemplary and cannot be construed as limitations of the present application, and those skilled in the art can make changes, modifications, substitutions and variations to the above embodiments within the scope of the present application.

What is claimed is:

1. A filter cable, comprising a core wire; wherein the core wire comprises an insulating substrate and a first conductor layer surrounding the insulating substrate; the first conductor layer has a first etching pattern; the first etching pattern is distributed along an axial direction of the filter cable; and the first etching pattern is used to make the filter cable equivalent to a first filter circuit to realize a filtering function; wherein the insulating substrate is arranged at the radial center of the core wire.

2. The filter cable according to claim 1, wherein the first etching pattern is distributed periodically or aperiodically along the axial direction of the filter cable.

3. The filter cable according to claim 1, wherein an etching area of the first etching pattern is hollow or filled with insulating material.

4. The filter cable according to claim 1, wherein the first conductor layer is plated on the insulating substrate or the first conductor layer is wrapped on the insulating substrate.

5. The filter cable according to claim 1, wherein the first etching pattern comprises a plurality of groups of cascade patterns;
   each group of cascade patterns comprises a first concave pattern, a second concave pattern and a third concave pattern which are opened along the axial direction of the filter cable, the third concave pattern surrounds an outer side of the second concave pattern, and the second concave pattern surrounds an outer side of the first concave pattern.

6. The filter cable according to claim 5, wherein sizes of the plurality of groups of cascaded patterns are different from one another.

7. The filter cable according to claim 1, wherein the first etching pattern comprises a pattern with a Hilbert fractal structure.

8. The filter cable according to claim 1, further comprising a first filling layer surrounding the core wire and a second conductor layer surrounding the first filling layer; wherein the second conductor layer has a second etching pattern; the second etching pattern is distributed along the axial direction of the filter cable; and the second etching pattern is used to make the filter cable equivalent to a second filter circuit to realize the filtering function.

9. The filter cable according to claim 8, wherein a shape of the second etching pattern is the same as that of the first etching pattern; alternatively, the shape of the second etching pattern is different from that of the first etching pattern.

10. The filter cable according to claim 8, further comprising a second filling layer surrounding the second conductor layer and a shielding layer surrounding the second filling layer; wherein a ground terminal is provided on the shielding layer.

* * * * *